US010304373B2

(12) United States Patent
Du

(10) Patent No.: US 10,304,373 B2
(45) Date of Patent: May 28, 2019

(54) DISPLAY DEVICE WITH ADJUSTABLE PIXEL DENSITY AND METHOD FOR ADJUSTING DISPLAY PIXEL DENSITY

(71) Applicant: BEIJING ZHIGU RUI TUO TECH CO., LTD., Beijing (CN)

(72) Inventor: Lin Du, Beijing (CN)

(73) Assignee: BEIJING ZHIGU RUI TUO TECH CO., LTD., Beijing (CN)

( * ) Notice: Subject to any disclaimer, the term of this patent is extended or adjusted under 35 U.S.C. 154(b) by 149 days.

(21) Appl. No.: 15/525,408

(22) PCT Filed: Oct. 10, 2015

(86) PCT No.: PCT/CN2015/091640
§ 371 (c)(1),
(2) Date: May 9, 2017

(87) PCT Pub. No.: WO2016/074550
PCT Pub. Date: May 19, 2016

(65) Prior Publication Data
US 2017/0316733 A1 Nov. 2, 2017

(30) Foreign Application Priority Data
Nov. 14, 2014 (CN) .......................... 2014 1 0645928

(51) Int. Cl.
G09G 3/20 (2006.01)
H01L 51/00 (2006.01)
(Continued)

(52) U.S. Cl.
CPC ......... G09G 3/2092 (2013.01); G09G 3/3208 (2013.01); H01L 27/156 (2013.01);
(Continued)

(58) Field of Classification Search
CPC ............... G09G 3/2092; G09G 3/3208; G09G 2300/0469; G09G 2380/02; G09G 3/20;
(Continued)

(56) References Cited

U.S. PATENT DOCUMENTS 6,800,838 B2 10/2004 Yamamoto
8,847,855 B2 9/2014 Daniel
(Continued)

FOREIGN PATENT DOCUMENTS

CN 1501508 6/2004
CN 101636776 A 1/2010
(Continued)

OTHER PUBLICATIONS

International Search Report and Written Opinion for Application No. PCT/CN2015/091640, dated Jan. 14, 2016, 9 pages.
(Continued)

Primary Examiner — Julie Anne Watko
(74) Attorney, Agent, or Firm — Sheppard Mullin Richter & Hampton LLP

(57) ABSTRACT

Embodiments of the present application disclose various display devices with adjustable pixel density and methods for adjusting display pixel density. One of the display devices with adjustable pixel density comprises: a plurality of display pixels distributed in an array form, and a controllably-deformable material part being separately connected to the plurality of display pixels, wherein the controllably-deformable material part may deform under an effect of an external field, so as to accordingly adjust density distribution of the plurality of display pixels. According to the technical solution provided by the embodiments of the present application, it may be able to achieve a display device with adjustable pixel density, and when an image is displayed by the display device with adjustable pixel den-
(Continued)

sity, integral pixels of the display device may be fully utilized to display different regions of the image with differentiated display definitions, so as to facilitate satisfying a user's diversified application demands.

19 Claims, 5 Drawing Sheets

(51) Int. Cl.
| | | |
|---|---|---|
| *H01L 27/15* | (2006.01) | |
| *H01L 51/56* | (2006.01) | |
| *H01L 27/32* | (2006.01) | |
| *G09G 3/3208* | (2016.01) | |

(52) U.S. Cl.
CPC .......... *H01L 27/32* (2013.01); *H01L 27/3225* (2013.01); *H01L 27/3241* (2013.01); *H01L 51/0097* (2013.01); *H01L 51/56* (2013.01); *G09G 2300/0469* (2013.01); *G09G 2380/02* (2013.01); *H01L 2251/5338* (2013.01)

(58) Field of Classification Search
CPC .. G09G 3/00; G09G 3/32; G09G 3/30; G09G 2300/0465; G09G 2300/0439; G09G 2300/0404; G09G 2300/04; G09G 2300/02; G09G 2300/00; G09G 2380/00; H01L 27/156; H01L 27/32; H01L 27/3225; H01L 51/0097; H01L 51/56; H01L 27/3241; H01L 2251/5338; H01L 2251/53; H01L 2251/50; H01L 2251/30; H01L 251/00; H01L 27/323; H01L 27/3233; H01L 27/3234; H01L 27/30; H01L 27/28; H01L 27/1218; H01L 27/00; H01L 51/525; H01L 51/52; H01L 51/50; H01L 51/00

See application file for complete search history.

(56) References Cited

U.S. PATENT DOCUMENTS

| | | | |
|---|---|---|---|
| 8,854,717 B2 | 10/2014 | Kim | |
| 8,861,064 B2 | 10/2014 | Lamprecht | |
| 9,232,571 B2 | 1/2016 | Ahn et al. | |
| 2008/0151089 A1 | 6/2008 | Street et al. | |
| 2008/0224948 A1* | 9/2008 | Alberth | G09G 3/20 345/1.3 |
| 2008/0224951 A1* | 9/2008 | Alberth | G06F 1/1601 345/55 |
| 2013/0027581 A1 | 1/2013 | Price et al. | |
| 2013/0278486 A1* | 10/2013 | Duerksen | G09G 3/34 345/55 |
| 2014/0232722 A1* | 8/2014 | Deluca | G09G 5/14 345/428 |
| 2017/0270849 A1* | 9/2017 | Lee | G09G 3/2092 |
| 2017/0316733 A1* | 11/2017 | Du | H01L 51/56 |
| 2017/0337904 A1* | 11/2017 | Du | G09G 3/32 |
| 2018/0005553 A1* | 1/2018 | Zhou | G09G 3/20 |

FOREIGN PATENT DOCUMENTS

| | | | | |
|---|---|---|---|---|
| CN | 101647050 A | | 2/2010 | |
| CN | 102201422 | | 9/2011 | |
| CN | 102597846 | | 7/2012 | |
| CN | 103545340 | | 1/2014 | |
| CN | 103713436 | | 4/2014 | |
| CN | 104459987 | | 3/2015 | |
| CN | 104459987 A | * | 3/2015 | ............ H01L 51/56 |
| JP | H10186249 | | 7/1998 | |
| JP | 2006-129411 | | 5/2006 | |
| WO | WO-2016074550 A1 | * | 5/2016 | ............ H01L 51/56 |

OTHER PUBLICATIONS

Bar-Cohen, Y., "Electroactive polymers for refreshable Braille displays," SPIE Newsroom, 2009, 3 pages.

Choi et al., "A Spatial-Temporal Multi-Resolution CMOS Image Sensor with Adaptive Frame Rates for Moving Objects in the Region-of-Interest," International Solid-State Circuits Conference, Image Sensors, ISSCC 2007, Session 28.2, p. 502-504. http://www.ece.umn.edu/groups/iml/publications/2007/ISSCC_Jchoi.pdf.

Ko et al., "A hemispherical electronic eye camera based on compressible silicon optoelectronics," Nature, Aug. 2008, vol. 454, p. 748-753.

Caliper LifeSciences, Living Image Software User's Manual, Version 4.2, 344 pages. http://www2.udel.edu/ctcr/sites/udel.edu.ctcr/files/Living_Image_4-2_User_Guide.pdf.

Ng et al., "Flexible image sensor array with bulk heterojunction organic photodiode," Applied Physics Letters, 2008, vol. 92, p. 213303.

Yu et al., "Directed bending of a polymer film by light," Nature, Sep. 2003, vol. 425, p. 145. doi:10.1038/425145a.

* cited by examiner

DISPLAY DEVICE WITH ADJUSTABLE PIXEL DENSITY AND METHOD FOR ADJUSTING DISPLAY PIXEL DENSITY

CROSS-REFERENCE TO RELATED APPLICATIONS

This application is a National Phase Application of International Application No. PCT/CN2015/091640, filed on Oct. 10, 2015, which claims the benefit of priority to Chinese Patent Application No. 201410645928.5, filed on Nov. 14, 2014, and entitled " Display device With Adjustable Pixel Density and Method For Adjusting Display Pixel Density", each of which is incorporated by reference herein in its entirety.

TECHNICAL FIELD

The present application relates to the field of display technologies, and in particular, to various display devices with adjustable pixel density and methods for adjusting display pixel density.

BACKGROUND

Conventional display technologies may not meet user's diversified application demands for image display. As users become having more personalized demands for image display, improvement technologies are continuously being developed.

For example, a user may have different requirements for display definitions of different images. As a result, the user may need a high-resolution display that supports multiple display modes with different resolutions, or two fixed display sections with different resolutions integrated into a same display, or the like.

SUMMARY

The following briefly describes the present application, so as to provide a basic understanding of some aspects of the present application. It should be understood that, the brief description is not an exhaustive brief description of the present application. The description is neither intended to determine key or important parts of the present application, nor intended to limit the scope of the present application. An objective thereof is merely to give some concepts in a simplified manner as a preface for more detailed description hereinafter.

The present application provides various display devices with adjustable pixel density and various methods for adjusting display pixel density.

In one aspect, an embodiment of the present application provides a display device with adjustable pixel density, comprising:

a plurality of display pixels distributed in a first array form; and a controllably-deformable material part, being separately connected to the plurality of display pixels, and deforming under an effect of an external field, so as to accordingly adjust density distribution of the plurality of display pixels.

In another aspect, an embodiment of the present application further provides a method for adjusting display pixel density, comprising:

applying an external field on a controllably-deformable material part, the controllably-deformable material part being connected to a plurality of display pixels distributed in an array form; and adjusting distribution of the external field to control the controllably-deformable material part to undergo corresponding deformation, so as to accordingly adjust density distribution of the plurality of display pixels.

According to the technical solution provided by the embodiments of the present application, distribution of an external field that acts on a controllably-deformable material part is adjusted to control the controllably-deformable material part to undergo corresponding deformation, so as to accordingly adjust density distribution of the plurality of display pixels, thereby achieving a display device with adjustable pixel density. When an image is displayed by the display device with adjustable pixel density, integral pixels of the display device may be fully utilized to display different regions of the image with differentiated display definitions, so as to facilitate better satisfying a user's diversified application demands.

The following describes in detail alternative embodiments of the present application with reference to accompanying drawings, to make these and other advantages of the present application more obvious.

BRIEF DESCRIPTION OF THE DRAWINGS

The present application may be understood better with reference to the following description in combination with accompanying drawings, wherein a same or similar accompanying drawing mark is used in all the accompanying drawings to represent a same or similar component. The accompanying drawings together with the following detailed description are comprised in the specification and constitute a part of the specification, and are used to further illustrate alternative embodiments of the present application and explain the principle and advantages of the present application. In the accompanying drawings.

A person skilled in the art should understand that, elements in the accompanying drawings are merely shown for simplicity and clarity, and are not necessarily drawn to scale. For example, in the accompanying drawings, the size of an element may be enlarged relative to another element, so as to facilitate enhancing an understanding of the embodiments of the present application.

DETAILED DESCRIPTION

The following will describe in details illustrative embodiments of the present application with reference to accompanying drawings. For the purpose of clear and brief description, the specification does not describe all features of practical implementation manners. However, it should be understood that, many decisions specific to the implementation manners must be made during development of any one of the practical embodiments, so as to achieve a specific objective of a developer, for example, conformance to restrictive conditions related with a system and service, wherein the restrictive conditions may vary with different implementation manners. In addition, it should also be understood that, although development work may be very complex and time-consuming, for a person skilled in the art that benefits from the content of the present disclosure, the development work is only a routine task.

Another point that should be noted here is, to avoid the present application from being not clearly understood due to unnecessary details, the accompanying drawings and specification merely describe apparatus structures and/or processing steps closely related to the solutions of the present application, but omit the representation and description of parts and processing that have little relation with the present application, and have been known by a person of ordinary skill in the art.

The following further describes in detail specific implementation manners of the present application with reference to the accompanying drawings (a same label represents a same element in several accompanying drawings) and embodiments. The following embodiments are used to describe the present application, but are not intended to limit the scope of the present application.

A person skilled in the art may understand that, terms such as "first" and "second" in the present application are merely used to distinguish different steps, devices or modules, which neither represent any specific technical meaning, nor represent a necessary logic sequence among them. "Display" and "display device" may be used interchangeably in this disclosure.

Figure 1:
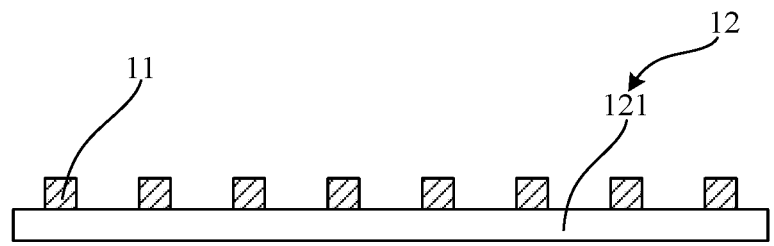
FIG. 1 is a schematic structural diagram of a first display with adjustable pixel density, according to an embodiment of the present application.

FIG. 1 is a schematic structural diagram of a display device with adjustable pixel density according to an embodiment of the present application. As shown in FIG. 1, the display device with adjustable pixel density provided by this embodiment of the present application comprises: a plurality of display pixels 11 and a controllably-deformable material part 12, wherein the display device performs image display by using the display pixels 11, and the plurality of display pixels 11 is distributed in an array form; the controllably-deformable material part 12 is separately connected to the plurality of display pixels 11; and the controllably-deformable material part 12 may deform under an effect of an external field, so as to accordingly adjust density distribution of the plurality of display pixels 11.

For the controllably-deformable material part, when an external field influencing factor acting thereon is changed, the controllably-deformable material part may be caused to deform; and when the external field influencing factor is removed or changed, deformation of the controllably-deformable material part may be recovered. The external field may be selected, according to deformability characteristics of the controllably-deformable material part, to be a corresponding external control field acting thereon. For example, the external field comprises but is not limited to an external electric field, magnetic field, light field, and the like.

One of the display pixels may comprise but not limited to at least one light emitting unit; and the light emitting unit may comprise but not limited to a light emitting diode (LED for short), and an organic light emitting diode (OLED for short). The color of light emitted by one of the light emitting unit may be determined according to actual demands. The light emitting unit may comprise but not limited to one or a plurality of light emitting sub-units, and the light emitting sub-unit may comprise an LED light emitting sub-unit, and an OLED light emitting sub-unit. The plurality of light emitting sub-units may comprise but not limited to an LED light emitting sub-unit and OLED light emitting sub-unit with different light colors such as red (R), green (G) and blue (B).

Among a plurality of display pixels distributed in an array form, each display pixel and a controllably-deformable material part may be closely connected by using (but not limited to) an adhesion manner, so that when the controllably-deformable material part deforms, an interval between the display pixels is accordingly adjusted, so as to change density distribution of display pixels, and achieve an effect of differentiated pixel density distribution in different regions of the display according to actual demands.

During implementation of this embodiment of the present application, the inventor of the present application found that, when a display device generally performs image display, density distribution of display pixels of the display is fixed. When image display is performed based on a display device with a fixed display pixel density, there is a certain limit in a display capability of the display device for satisfying a user's diversified application demands.

For example, a high-resolution display may be adopted to support multiple display modes with different resolutions. In the solution, a high-resolution display is generally selected, which comprises a great quantity of pixels and has a high cost. After some display mode is determined, definitions of various parts of an image displayed by the display device are changed totally and become identical. That is, various parts of the image all have a high definition or a low definition. When a display mode with a low definition is supported for image display, some of display pixels of the display device may not be fully utilized. If a user has demands for differentiated distribution of definitions of a displayed image, for example, expects a displayed image to be partially clear and partially blur, the solution may difficultly satisfy the user's application demands. Additionally, in some scenarios, such as a scenario that an image to be displayed is a high-definition image, if a high-resolution display is adopted to display the image, power consumption needed is great for a high-resolution display generally has a high display pixel density. Sometimes, a user may have different requirements for display definitions of different regions of an image, for example, the user may only focus on a definition of a part (such as a human face, a license plate number, and another region of interest) in the image, but has low definition requirements for another part (such as a background or a road) in the image. In this case, if the image is displayed by simply adopting a high-resolution display screen, it may lead to low actual usage of display pixels and increased power consumption.

For another example, two fixed display sections with different resolutions may be integrated into a same display. Although a displayed image with two different resolutions may be displayed on a display screen in the solution, pixel densities of the two display sections are also fixed, that is, limited resolution modes that can be provided fail to well match with a user's diversified application demands. The implementation manner is not flexible.

However, according to the technical solution provided by this embodiment of the present application, distribution of an external field that acts on a controllably-deformable material part is adjusted to control the controllably-deformable material part to undergo corresponding deformation, so as to accordingly adjust density distribution of the plurality of display pixels, thereby achieving a display device with adjustable pixel density of. When an image is displayed by the display device with adjustable pixel density, integral pixels of the display device may be fully utilized to display different regions of the image with differentiated display definitions. In some scenarios, for example, when a part of an image reaches a high display definition, similar to adopting a solution of using a high-resolution display, adopting the technical solution provided by this embodiment of the present application to use a low-resolution display under the same condition, may satisfy a user's display demands for a part of an image, improve actual usage of display pixels of the display device, and have a low power consumption. Additionally, adjustment on density distribution of display pixels of a display device may be performed according to actual display demands of a user or a device, and the implementation manner is very flexible, so as to facilitate better satisfying a user's diversified application demands.

In practical application of the technical solution provided by this embodiment of the present application, an unevenly distributed external field may be applied on different regions of the controllably-deformable material part, to cause the different regions of the controllably-deformable material part to undergo different degrees of deformation, thereby adjusting integral density distribution of display pixels. Optionally, the external field may be applied on a region where the controllably-deformable material part and the plurality of display pixels are not overlapped, to cause an overlap region of the controllably-deformable material part and the plurality of display pixels not to deform. Instead, density distribution of display pixels is changed through deformation of another part of the controllably-deformable material part. This solution is favorable to avoiding damage to the display pixels by deformation of the controllably-deformable material part.

Further, the controllably-deformable material part may be made by selecting at least one suitable controllably-deformable material as demanded, to cause the controllably-deformable material part to have deformability and deformation recoverability characteristics. Optionally, the controllably-deformable material part is made from at least one or more of the following controllably-deformable materials: a piezoelectric material, an electro-active polymer, a photo-deformable material, and a magnetostrictive material.

The piezoelectric material may undergo mechanical deformation under an effect of an electric field. A controllably-deformable material part made by using the piezoelectric material is referred to as a piezoelectric material part below. With this physical property of the piezoelectric material, electric field control information required for causing the piezoelectric material part to undergo corresponding mechanical deformation may be determined in this embodiment of the present application. For example, electric field control information required for causing the piezoelectric material part to undergo corresponding mechanical deformation is determined according to (but not limited to) target pixel density distribution information about image display, and an electric field acting on the piezoelectric material part is controlled according to the electric field control information, to cause the piezoelectric material part to undergo corresponding mechanical deformation, so as to accordingly adjust pixel density distribution of a display device, thereby achieving a purpose of adjusting pixel density distribution of the display according to the target pixel density distribution information. The target pixel density distribution information about image display is generally used for representing a relative expectation of a user or a device for display definitions of different regions of the image. For example, in an image to be displayed, a region with a high expectation of a display definition is expected to be displayed by using a high display pixel density, so that a target pixel density corresponding to the displayed region is higher, thereby improving a display definition of the region in the image. For another region of the image, requirements for an image display definition may be appropriately reduced, and another region of the image may be displayed with a low display pixel density. In this way, target pixel densities displayed corresponding to different regions of an image are caused to vary. The piezoelectric material may comprise but is not limited to at least one of the following: a piezoelectric ceramic, and a piezoelectric crystal. This solution can fully utilize a physical property of a piezoelectric material to adjust pixel density distribution of a display. The electro-active polymers (EAP for short) are a type of polymer materials that may be changed in shape or size under an effect of an electric field. A controllably-deformable material part made by using the electro-active polymer is referred to as an electro-active polymer part below. With this physical property of the electro-active polymer, electric field control information required for causing the electro-active polymer part to undergo corresponding deformation may be determined in this embodiment of the present application. For example, electric field control information required for causing the electro-active polymer part to undergo corresponding deformation is determined according to (but not limited to) the target pixel density distribution information, and an electric field acting on an electro-active polymer layer is controlled according to the electric field control information, to cause the electro-active polymer layer to undergo corresponding deformation, so as to accordingly adjust pixel density distribution of a display device, thereby achieving a purpose of adjusting pixel density distribution of the display according to the target pixel density distribution information. The electro-active polymer may comprise but is not limited to at least one of the following: an electronic electro-active polymer, and an ionic electro-active polymer, wherein the electronic electro-active polymer comprises at least one of the following: a ferroelectric polymer (such as polyvinylidene fluoride), an electrostrictive graft polymer, and a liquid crystalline elastomer; and the ionic electro-active polymer comprises at least one of the following: an electro-rheological fluid, and an ionic polymer-metal composite. This solution can fully utilize a physical property of an electro-active polymer to adjust pixel density distribution of a display device.

The photo-deformable material is a type of macromolecule material that may exhibit a change in shape or size under an effect of a light field. A controllably-deformable material part made by using the photo-deformable material is referred to as a photo-deformable material part below.

With this physical property of the photo-deformable material, light field control information required for causing a photo-deformable material part to undergo corresponding deformation may be determined in this embodiment of the present application. For example, light field control information required for causing a photo-deformable material part to undergo corresponding deformation is determined according to (but not limited to) the target pixel density distribution information, and a light field acting on the photo-deformable material part is controlled according to the light field control information, to cause the photo-deformable material part to undergo corresponding deformation. Pixel density distribution of a display device is accordingly adjusted through deformation of the photo-deformable material part, thereby achieving a purpose of adjusting pixel density distribution of the display device according to the target pixel density distribution information. The photo-deformable material may comprise but is not limited to at least one of the following: a photo-strictive ferroelectric ceramic and a photo-deformable polymer, wherein the photo-strictive ferroelectric ceramic comprises but is not limited to a lead lanthanum zirconate titanate (PLZT) ceramic, and the photo-deformable polymer comprises but is not limited to a photo-deformable liquid crystalline elastomer. This solution can fully utilize a physical property of a photo-deformable material to adjust pixel density distribution of a display device.

The magnetostrictive material is a type of magnetic material that may exhibit a change in magnetic state under an effect of a magnetic field, and then exhibit a change in size thereof. A controllably-deformable material part made by using the magnetostrictive material is referred to as a magnetostrictive material part below. With this physical property of the magnetostrictive material, magnetic field control information required for causing a magnetostrictive material part to undergo corresponding deformation may be determined in this embodiment of the present application. For example, magnetic field control information required for causing a magnetostrictive material part to undergo corresponding deformation is determined according to (but not limited to) the target pixel density distribution information, and a magnetic field acting on the magnetostrictive material part is controlled according to the magnetic field control information, to cause the magnetostrictive material part to undergo corresponding deformation. Pixel density distribution of a display device is accordingly adjusted through deformation of the magnetostrictive material part, thereby achieving a purpose of adjusting pixel density distribution of the display according to the target pixel density distribution information. The magnetostrictive material may comprise but is not limited to a rare-earth iron giant magnetostrictive material, such as an alloy material Tbo0.3Dy0.7Fe1.95 with a compound (Tb, Dy)Fe2 as a substrate. This solution can fully utilize a physical property of a magnetostrictive material to adjust pixel density distribution of a display device.

In the technical solutions provided by this embodiment of the present application, specific structures and connection manners of various display pixels and the controllably-deformable material part may be determined according to actual demands, and the implementation manner is very flexible.

In an alternative implementation manner, as shown in FIG. 1, the controllably-deformable material part 12 comprises a controllably-deformable material layer 121, wherein the plurality of display pixels 11 is distributed in an array form and connected to a surface of the controllably-deformable material layer 121. Optionally, depending on actual technological conditions, the plurality of display pixels may be directly formed on the controllably-deformable material layer 12, or the plurality of display pixels and the controllably-deformable material layer 12 may be separately made and closely connected by using (but not limited to) an adhesion manner. This solution features a simple structure and is easily implemented.

Figure 2:
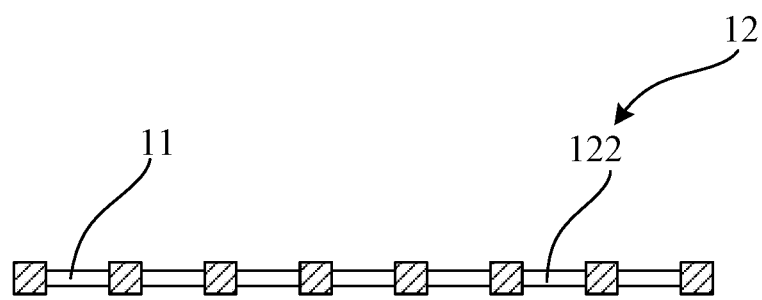
FIG. 2 is a schematic structural diagram of a second display with adjustable pixel density, according to an embodiment of the present application.

In another alternative implementation manner, as shown in FIG. 2, the controllably-deformable material part 12 comprises a plurality of controllably-deformable material connection sub-parts 122, wherein the plurality of controllably-deformable material connection sub-parts 122 is distributed in an array form, and correspondingly connected to the plurality of display pixels 11 distributed in an array form, that is, the plurality of display pixels distributed in an array form is connected as a whole through the plurality of controllably-deformable material connection sub-parts that is distributed in an array form. Optionally, depending on actual technologies, the plurality of controllably-deformable material connection sub-parts may be formed in an interval between pixels of a display device pixels array, and connected to corresponding display pixels by using (but not limited to) an abutting or adhesion manner. Density distribution of display pixels may be adjusted by means of controlling deformation of the plurality of controllably-deformable material connection sub-parts, which features a simple structure and is easily implemented.

Figure 3:
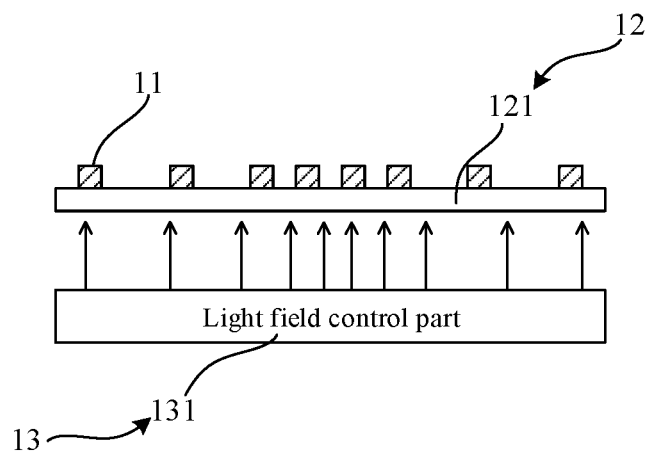
FIG. 3 is a schematic structural diagram of a third display with adjustable pixel density, according to an embodiment of the present application.
Figure 4:
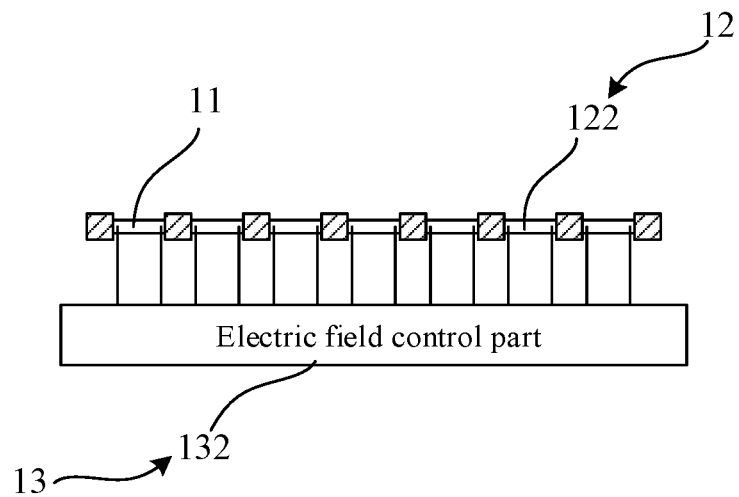
FIG. 4 is a schematic structural diagram of a fourth display with adjustable pixel density, according to an embodiment of the present application.

Further, as shown in FIG. 3 and FIG. 4, the display device may further comprise a deformation control part 13, wherein the deformation control part 13 is configured to adjust distribution of the external field acting on the controllably-deformable material part 12, so as to control the controllably-deformable material part 12 to undergo corresponding deformation. In this way, when the controllably-deformable material part 12 undergoes deformation, an interval between the display pixels 11 may be accordingly adjusted, so as to change density distribution of the display pixels 11, thereby achieving an effect of differentiated pixel density distribution in different regions of the display device according to actual demands.

Optionally, as shown in FIG. 3, the deformation control part may comprise a light field control part 131, wherein the light field control part 131 is configured to adjust distribution of an external light field acting on the controllably deformable material part 12, so as to control the controllably-deformable material part 12 to undergo corresponding deformation. Under this circumstance, the controllably-deformable material part 12 may comprise a photo-deformable material part at least made from a photo-deformable material. For example, the photo-deformable material part may comprise a photo-deformable material layer at least made from the photo-deformable material; or the photo-deformable material part may comprise a plurality of photo-deformable material connection sub-parts at least made from the photo-deformable material. Different regions of the controllably-deformable material part 12 are excited to undergo different degrees of deformation by means of changing, by the light field control part 131, distribution of a light field acting on the photo-deformable material part (in FIG. 3, different arrow densities are used for representing different intensity distribution of a light field acting on the controllably-deformable material part 12), and an interval between the display pixels 11 is accordingly adjusted through deformation of the controllably-deformable material part 12, so as to change density distribution of the display pixels 11, thereby achieving an effect of differentiated pixel density distribution in different regions of the display according to actual demands.

Figure 5:
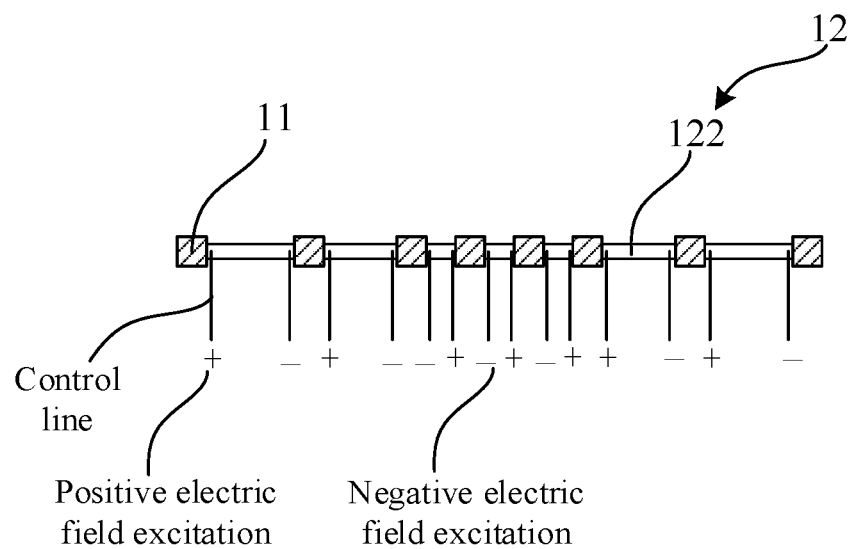
FIG. 5 is a scenario example of pixel density adjustment performed on a display device under a circumstance of uneven light field excitation, according to an embodiment of the present application.

Optionally, as shown in FIG. 4, the deformation control part may comprise an electric field control part 132, wherein the electric field control part 132 is configured to adjust a distribution of an external electric field acting on the controllably-deformable material part, so as to control the controllably-deformable material part to undergo corresponding deformation. Under this circumstance, the controllably-deformable material part 12 may comprise a piezoelectric material part (such as a piezoelectric material layer or a piezoelectric material connection sub-part) at least made from a piezoelectric material, or the controllably-deformable material part 12 may comprise an electro-active polymer part (such as an electro-active polymer layer or an electro-active polymer connection sub-part) at least made from an electro-active polymer. As shown in FIG. 4, an electric field control part and a controllably-deformable material may be connected by using a control line. Different regions of the controllably-deformable material part 12 are excited to undergo different degrees of deformation by means of changing by the electric field control part 132 distribution of an electric field acting on the controllably-deformable material part 12. If the electric field acting on the controllably-deformable material part 12 is a zero electric field, the controllably-deformable material part will not deform (which may be referred to as zero electric field excitation); if intensity distribution of the electric field acting on the controllably-deformable material part 12 is changed (such as positive electric field excitation "+" and negative electric field excitation "−" as shown in the figure), the intensity of the electric field acting on different regions of the controllably-deformable material part 12 is caused to vary, as shown in FIG. 5. In this way, different regions of the controllably-deformable material part 12 may undergo different degrees of deformation, and an interval between the display pixels 11 is accordingly adjusted through deformation of the controllably-deformable material part 12, so as to change density distribution of integral pixels of a display device, thereby achieving an effect of differentiated pixel density distribution in different regions of the display according to actual demands.

In this embodiment of the present application, the controllably-deformable material part may be directly or indirectly connected to the deformation control part. The deformation control part may act as a part of the display or not. The display may be connected to the deformation control part in a manner such as reserving a pin or an interface. The external field acting on the controllably-deformable material part may comprise but is not limited to an electric field, a magnetic field, a light field, or the like. A hardware and software structure used for generating an electric field, a hardware and software structure used for generating a magnetic field, and a hardware and software structure used for generating a light field, may be implemented by using corresponding existing technologies according to actual demands. The details are not described again in this embodiment of the present application.

Figure 6:
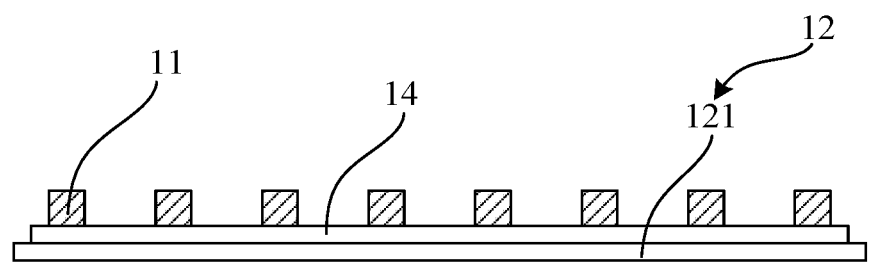
FIG. 6 is a schematic structural diagram of a fifth display with adjustable pixel density, according to an embodiment of the present application.
Figure 7:
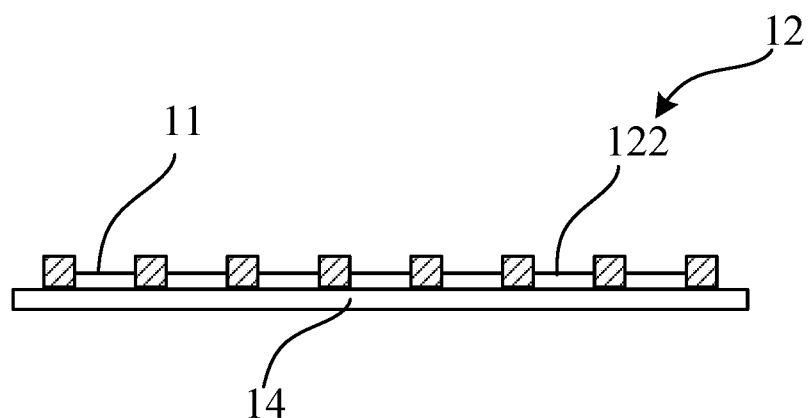
FIG. 7 is a schematic structural diagram of a sixth display with adjustable pixel density, according to an embodiment of the present application.

Optionally, the display may further comprise a flexible substrate, wherein the flexible substrate may comprise but is not limited to a flexible plastic substrate with a certain flexibility. The shape of the flexible substrate may be changed as demanded. Display pixels and a controllably-deformable material part may be disposed on a same side or different sides of the flexible substrate. For example, as shown in FIG. 6, the plurality of display pixels 11 is connected to a surface of a flexible substrate 14, and a controllably-deformable material part (such as a controllably-deformable material layer 121) is connected to another surface of the flexible substrate 14. For another example, as shown in FIG. 7, the plurality of display pixels 11 is connected to a surface of a flexible substrate 14, and a controllably-deformable material part (such as a controllably-deformable material connection sub-part 122) is connected to corresponding display pixels and located with the display pixels 11 on the same surface of the flexible substrate 14. In this solution, integral pixel density distribution of a display device may be indirectly adjusted through deformation of a controllably-deformable material part under control of an external field acting thereon, thereby achieving the display with adjustable pixel density. In addition, the shape of the display may also be flexibly changed by using a flexible substrate, for example, a planar display is bent to a certain angular degree, so as to obtain a curved display, thereby satisfying diversified application demands of image acquisition, decoration and the like.

Figure 8:
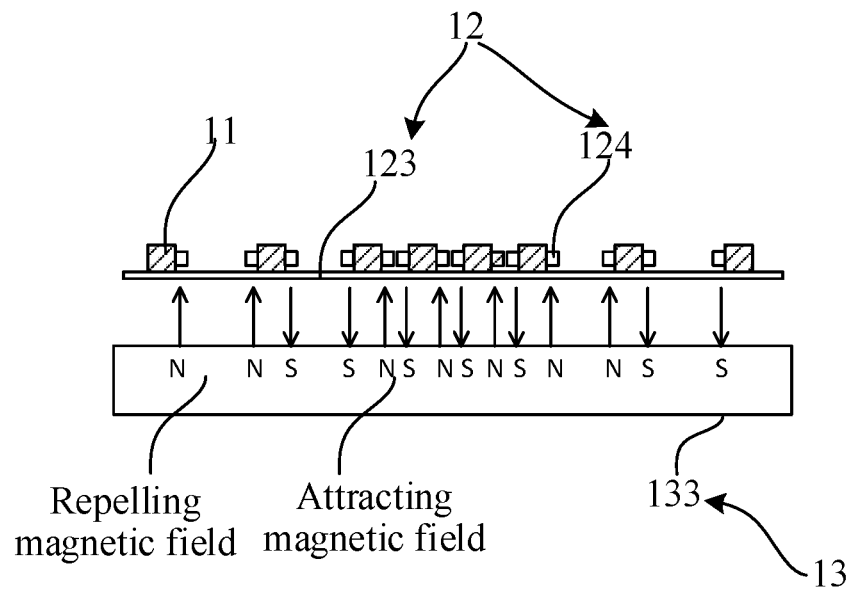
FIG. 8 is a schematic structural diagram of a seventh display with adjustable pixel density, according to an embodiment of the present application.

FIG. 8 is a schematic structural diagram of a seventh display with adjustable pixel density according to an embodiment of the present application. In the display as shown in FIG. 8, the controllably-deformable material part 12 comprises a flexible substrate 123 and a plurality of magnetic conductive material parts 124, wherein a plurality of display pixels 11 is separately connected to the flexible substrate 123, and at least some of the display pixels 11 are connected to the plurality of magnetic conductive material parts 124. The flexible substrate 123 is caused to undergo corresponding deformation by change of a magnetic field acting on the magnetic conductive material part 124, and density distribution of the plurality of display pixels 11 is accordingly adjusted through the deformation. For example, a conductive material part 124 may be disposed on a side surface of each display pixel. Optionally, the display pixels 11 are separately adhered to the flexible substrate 123 and the magnetic conductive material part 124. The magnetic conductive material part may comprise a magnetic pole made from a magnetic conductive material, wherein the magnetic conductive material may comprise but is not limited to one or more of a soft magnetic material, a silicon steel sheet, a permalloy, a ferrite, an amorphous soft magnetic alloy, a super-microcrystalline soft magnetic alloy, and the like. The magnetic conductive material part made from a soft magnetic material has a good magnetic conductivity, and after removal of a magnetic field, residual magnetism is very small, which facilitates adjustment next time.

Further, optionally, the deformation control part 13 in this embodiment of the present application may further comprise a magnetic field control part 133, wherein the magnetic field control part 133 is configured to adjust distribution of an external magnetic field acting on the controllably-deformable material part, so as to control the controllably-deformable material part to undergo corresponding deformation. For example, when the magnetic control part 133 controls a magnetic field (namely, an exciting magnetic field) that acts on the magnetic conductive material part 124 to change, as shown in FIG. 8, a repelling magnetic field induced by same magnetic poles (NN or SS) or an attracting magnetic field induced by different magnetic poles (NS or SN) with a certain distribution intensity is imposed on adjacent display pixels, a force of magnetic repulsion or attraction between magnetic poles will be induced accordingly. The magnetic force is transmitted to the flexible substrate 123, to cause the flexible substrate 123 to undergo deformation such as expansion and compression, thereby changing an interval between corresponding display pixels, and achieving a purpose of adjusting density distribution of display pixels. In combination with deformability (such as expandability and shrinkage) characteristics of a flexible substrate and the principle of magnetic field control, this solution can achieve adjustable pixel density distribution of a display device.

Figure 9:
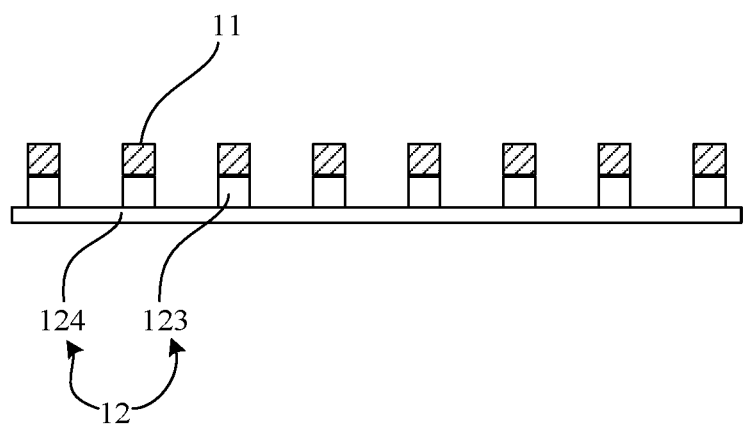
FIG. 9 is a schematic structural diagram of an eighth display with adjustable pixel density, according to an embodiment of the present application.

FIG. 9 is a schematic structural diagram of an eighth display with adjustable pixel density according to an embodiment of the present application. In the display as shown in FIG. 9, the controllably-deformable material part 12 comprises: a flexible substrate 123 and a plurality of magnetic conductive material parts 124, wherein a surface of each of the plurality of magnetic conductive material parts 124 is separately connected to the flexible substrate 123, and an opposite surface of each of the plurality of magnetic conductive material parts 124 is separately connected to the plurality of display pixels 11 correspondingly. The flexible substrate 123 is caused to undergo corresponding deformation by change of a magnetic field acting on the magnetic conductive material part 124, so as to accordingly adjust density distribution of the plurality of display pixels 11. Optionally, the magnetic conductive material part 124 is adhered to the flexible substrate 123, and the display pixels 11 are adhered to the magnetic conductive material part 124. When a magnetic field acting on the magnetic conductive material part 124 changes, a magnetic force is transmitted to the flexible substrate 123, and causes the flexible substrate 123 to deform such as expand or shrink, thereby achieving a purpose of adjusting density distribution of display pixels. In combination with deformability (such as expandability and shrinkage) characteristics of a flexible substrate and the principle of magnetic field control, this solution can achieve adjustable pixel density distribution of a display device.

Figure 10:
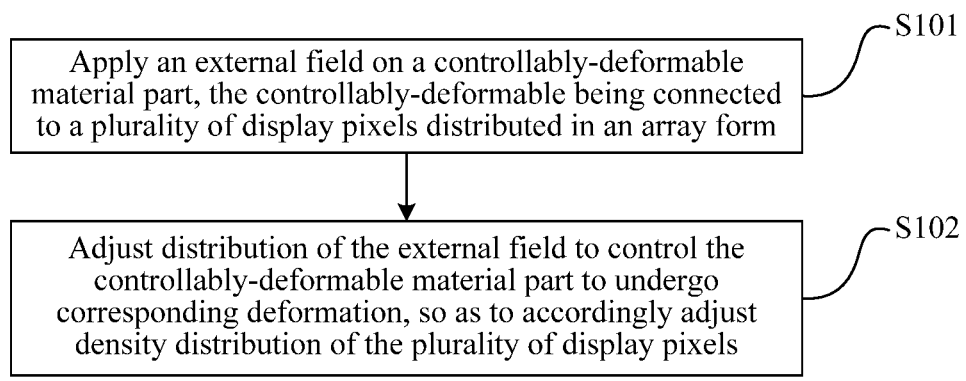
FIG. 10 is a flowchart of a method for adjusting display pixel density, according to an embodiment of the present application.

FIG. 10 is a flowchart of a method for adjusting display pixel density according to an embodiment of the present application. As shown in FIG. 10, the method for adjusting display pixel density provided by this embodiment of the present application comprises:

Step S101: Apply an external field on a controllably-deformable material part, the controllably-deformable being connected to a plurality of display pixels distributed in an array form.

S102: Adjust distribution of the external field to control the controllably-deformable material part to undergo corresponding deformation, so as to accordingly adjust density distribution of the plurality of display pixels.

In practical application, an unevenly distributed external field may be applied on different regions of the controllably-deformable material part, to cause the different regions of the controllably-deformable material part to undergo different degrees of deformation, thereby adjusting integral density distribution of display pixels.

Optionally, the applying an external field on a controllably-deformable material part, comprises: applying the external field on a region where the controllably-deformable material part and the plurality of display pixels are not overlapped. In the solution, an overlap region of the controllably-deformable material part and the display pixels may not undergo deformation. Instead, density distribution of display pixels is changed through deformation of another part of the controllably-deformable material part, so as to facilitate avoiding damage to the display pixels by deformation of the controllably-deformable material part.

Optionally, the controllably-deformable material part is made from at least one or more of the following controllably-deformable materials: a piezoelectric material, an electro-active polymer, and a photo-deformable material. The controllably-deformable material part may have deformability and deformation recoverability characteristics by using the above selected materials.

Optionally, the adjusting distribution of the external field to control the controllably-deformable material part to undergo corresponding deformation, comprises: adjusting distribution of an external electric field to control the controllably-deformable material part to undergo corresponding deformation. Under this circumstance, the controllably-deformable material part may be made from at least a piezoelectric material or an electro-active polymer. By means of changing distribution of an electric field that acts on the controllably-deformable material part, different regions of the controllably-deformable material part are excited to undergo different degree of deformation, so as to change integral pixel density distribution of a display device, thereby achieving an effect of differentiated pixel density distribution in different regions of the display according to actual demands.

Optionally, the adjusting distribution of the external field to control the controllably-deformable material part to undergo corresponding deformation, comprises: adjusting distribution of an external light field to control the controllably-deformable material part to undergo corresponding deformation. Under this circumstance, the controllably-deformable material part may be made from at least a photo-deformable material. By means of changing distribution of a light field that acts on the controllably-deformable material part, different regions of the controllably-deformable material part are excited to undergo different degrees of deformation, and an interval between the display pixels is accordingly adjusted through deformation of the controllably-deformable material part, so as to accordingly change integral pixel density distribution of the display, thereby achieving an effect of differentiated pixel density distribution in different regions of a display device according to actual demands.

Optionally, the adjusting distribution of the external field to control the controllably-deformable material part to undergo a corresponding deformation, comprises: adjusting distribution of an external magnetic field to control the controllably-deformable material part to undergo corresponding deformation. Under this circumstance, the controllably-deformable material part may be made from at least a magnetostrictive material. By means of changing distribution of a magnetic field that acts on a magnetostrictive material, different regions of the magnetostrictive material are excited to undergo different degrees of deformation, and an interval between the display pixels is accordingly adjusted through deformation of the magnetostrictive material part. Alternatively, under this circumstance, the controllably-deformable material part comprises a flexible substrate and a plurality of magnetostrictive material parts, wherein distribution of a magnetic field that acts on the magnetostrictive material parts is changed, so as to cause the flexible substrate to undergo corresponding deformation, thereby accordingly adjusting an interval between display pixels. In all the above solutions, density distribution of display pixels can be changed, so as to achieve an effect of differentiated pixel density distribution in different regions of a display device according to actual demands.

If the technical solution provided by the embodiments of the present application is adopted, it may be achieved a display with adjustable pixel density, and when an image is displayed based on a display device with adjustable pixel density, integral pixels of the display may be fully utilized to display different regions of the image with differentiated display definitions, and improve actual usage of display pixels, so as to facilitate satisfying a user's diversified application demands. The display with adjustable pixel density may be applied in a device having an image display function. For example, the display may be applied in but not limited to the following devices: a television, a computer, a camera, a mobile phone, a video recorder, and the like.

In an alternative application scenario, target pixel density distribution information may be acquired for an image to be displayed, and desired distribution of an external field acting on the controllably-deformable material part is determined according to the target pixel density distribution information. The controllably-deformable material part is caused to deform by means of changing the external field that acts on the controllably-deformable material part, so as to change an original interval between various display pixels, that is, to adjust pixel density distribution of the display. Then image display is performed based on a display device with an adjusted pixel density.

When a display device with adjustable pixel density provided by this embodiment of the present application is adopted for image display, integral pixels of the display may be fully utilized. For example, existing pixel density distribution of the display is adjusted according to the target pixel density distribution information, to cause pixel density distribution of the flexible display after being adjusted to correspond to the target pixel density distribution information, or to cause pixel density distribution of the flexible display after being adjusted to be as close as possible to the target pixel density distribution information, thereby achieving an effect of displaying different regions of an image with different pixel densities. Different regions of the image finally displayed have different definitions. For example, a display region with a high display pixel density display devices a part of the displayed image with a high definition, and a display region with a low display pixel density display devices a part of the displayed image with a low definition. In this way, different regions of a same image are displayed in a manner of using differentiated definitions, which is favorable to satisfying a user's diversified application demands.

After display pixel density of a display device is adjusted by using the technical solution according to this embodiment of the present application, the display pixel density of the display is unevenly distributed, for which a flexible display control technology may be determined according to actual demands, so as to control a display device after being adjusted to perform image display, thereby improving user experience. The specific display control technology is not limited in this embodiment of the present application. For example, in some scenarios, it may be determined according to actual demands whether an original image to be displayed is processed by means of sampling adaption according to actual spatial locations of display pixels after being adjusted, and/or whether a scan driving manner of a display device is processed by one or more means such as drive adaption and adjustment according to actual spatial locations of display pixels after being adjusted, so as to cause display (such as size and shape) scales of different regions of an image actually displayed by a display device after being adjusted to match with display (such as size and shape) scales of corresponding regions of an original image, and the like.

It may be understood by a person skilled in the art that, in any one of the foregoing methods of specific implementation manners of the present application, the value of the serial number of each step described above does not mean an execution sequence, and the execution sequence of the steps should be determined according to the function and internal logic thereof, and should not constitute any limitation to the implementation procedure of the specific implementation manners of the present application.

In the foregoing embodiments of the present application, the serial number and/or sequence of the embodiments are only used for the convenience of description, and do not represent inferiority or superiority of the embodiments. The description of each embodiment has different focus. For any part of an embodiment not described in details, refer to relevant description of another embodiment. For related description of the implementation principle or process of the display, refer to records of corresponding method embodiments. For the structure of the display involved in the method embodiments, refer to records of corresponding display embodiments. The details are not described herein again.

A person of ordinary skill in the art may recognize that, the units, methods and procedures of each example described with reference to the embodiments disclosed herein, can be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of the present application.

When the functions are implemented in a form of a software functional unit and sold or used as an independent product, the functions may be stored in a computer-readable storage medium. Based on such an understanding, the technical solutions of the present application essentially, or a part thereof contributing to the existing art, or a part of the technical solutions may be implemented in the form of a software product. The computer software product is stored in a storage medium and comprises several instructions for instructing a computer device (which may be a personal computer, a server, a network device, or the like) to perform all or some of the steps of the methods in the embodiments of the present application. The foregoing storage medium comprises: any medium that can store program code, such as a USB flash drive, a removable hard disk, a read-only memory (ROM for short), a random access memory (RAM for short), a magnetic disk, or a light disc.

In the apparatus, method and system embodiments of the present application, apparently, each component (such as a system, a sub-system, a module, a sub-module, a unit, and a sub-unit) or each step may be decomposed, combined and/or recombined after decomposition. Such decomposition and/or recombination shall be considered as an equivalent solution of the present application. In addition, in the above description of specific embodiments of the present application, a feature described and/or shown in one implementation manner may be used in one or more other implementation manners in a same or similar manner, combined with a feature of another implementation manner, or replace a feature of another implementation manner.

It should be emphasized that, the term "comprise" used herein refers to existence of a feature, an element, a step or a component, but does not exclude existence or addition of one or more other features, elements, steps or components.

Finally, it should be noted that, the above implementation manners are only used to describe the present application, rather than limit the present application. Various alterations and variants may also be made by a person of ordinary skill in the art without departing from the spirit and scope of the present application. Therefore, all equivalent technical solutions also belong to the scope of the present application, and the patent protection scope of the present application should be subject to the claims.

What is claimed is:

1. A display device with adjustable pixel density, comprising:
   a plurality of display pixels distributed in a first array form; and
   a controllably-deformable material part, being separately connected to the plurality of display pixels, and deforming under an effect of an external field, so as to accordingly adjust density distribution of the plurality of display pixels.

2. The display of claim 1, wherein the controllably-deformable material part comprises a controllably-deformable material layer, the plurality of display pixels being connected to a surface of the controllably-deformable material layer.

3. The display of claim 2, wherein the display further comprises a flexible substrate, the plurality of display pixels being connected to a surface of the flexible substrate.

4. The display of claim 3, wherein the controllably-deformable material part is connected to another surface of the flexible substrate.

5. The display of claim 1, wherein the controllably-deformable material part comprises a plurality of controllably-deformable material connection sub-parts distributed in a second array form and correspondingly connected to the plurality of display pixels distributed in the first array form.

6. The display of claim 1, wherein the controllably-deformable material part includes at least one or more of a piezoelectric material, an electro-active polymer, a photo-deformable material, and a magneto-strictive material.

7. The display of claim 1, wherein the controllably-deformable material part comprises a flexible substrate and a plurality of magnetic conductive material parts, the plurality of display pixels being separately connected to the flexible substrate, at least some of the display pixels being connected to the plurality of magnetic conductive material parts, and the flexible substrate being caused to undergo corresponding deformation by means of changing a magnetic field that acts on the magnetic conductive material part, so as to accordingly adjust density distribution of the plurality of display pixels.

8. The display of claim 1, wherein the controllably-deformable material part comprises a flexible substrate and a plurality of magnetic conductive material parts, a surface of each of the plurality of magnetic conductive material parts being separately connected to the flexible substrate, an opposite surface of each of the plurality of magnetic conductive material parts being separately connected to the plurality of display pixels correspondingly, and the flexible substrate being caused to undergo corresponding deformation by means of changing a magnetic field that acts on the magnetic conductive material part, so as to accordingly adjust density distribution of the plurality of display pixels.

9. The display of claim 1, further comprising:
   a deformation control part, configured to adjust distribution of the external field that acts on the controllably-deformable material part, so as to control the controllably-deformable material part to undergo corresponding deformation.

10. The display of claim 9, wherein the deformation control part comprises:
    an electric field control part, configured to adjust distribution of an external electric field that acts on the controllably-deformable material part, so as to control the controllably-deformable material part to undergo corresponding deformation.

11. The display of claim 9, wherein the deformation control part comprises:
    a light field control part, configured to adjust distribution of an external light field that acts on the controllably-deformable material part, so as to control the controllably-deformable material part to undergo corresponding deformation.

12. The display of claim 9, wherein the deformation control part comprises:
    a magnetic field control part, configured to adjust distribution of an external magnetic field that acts on the controllably-deformable material part, so as to control the controllably-deformable material part to undergo corresponding deformation.

13. A method for adjusting display pixel density comprising:
    applying an external field on a controllably-deformable material part, the controllably-deformable being connected to a plurality of display pixels distributed in an array form; and
    adjusting distribution of the external field to control the controllably-deformable material part to undergo corresponding deformation, so as to accordingly adjust density distribution of the plurality of display pixels.

14. The method for adjusting display pixel density of claim 13, wherein the applying an external field on the controllably-deformable material part comprises:
    applying the external field on a region where the controllably-deformable material part and the plurality of display pixels are not overlapped.

15. The method for adjusting display pixel density of claim 13, wherein the controllably-deformable material part includes at least one or more of a piezoelectric material, an electro-active polymer, a photo-deformable material, and a magnetostrictive material.

16. The method for adjusting display pixel density of claim 13, wherein the adjusting distribution of the external field to control the controllably-deformable material part to undergo corresponding deformation comprises:
    adjusting distribution of an external electric field to control the controllably-deformable material part to undergo corresponding deformation.

17. The method for adjusting display pixel density of claim 13, wherein the adjusting distribution of the external field to control the controllably-deformable material part to undergo corresponding deformation comprises:
    adjusting distribution of an external light field to control the controllably-deformable material part to undergo corresponding deformation.

18. The method for adjusting display pixel density of claim 13, wherein the adjusting distribution of the external field to control the controllably-deformable material part to undergo corresponding deformation comprises:
    adjusting distribution of an external magnetic field to control the controllably-deformable material part to undergo corresponding deformation.

19. A system, comprising a processor; and a memory, the memory storing computer executable instructions, the processor being connected to the memory, and configured to execution the instructions to cause the processor to perform:

applying an external field on a controllably-deformable material part, the controllably-deformable being connected to a plurality of display pixels distributed in an array form; and adjusting distribution of the external field to control the controllably-deformable material part to undergo corresponding deformation, so as to accordingly adjust density distribution of the plurality of display pixels.

* * * * *